United States Patent

[11] 3,579,131

[72] Inventor Toshio Fukuda
Takatsuki, Osaka, Japan
[21] Appl. No. 765,957
[22] Filed Oct. 8, 1968
[45] Patented May 18, 1971
[73] Assignee Shimadzu Seisakusho Ltd.
Nakagyo-ku, Kyoto, Kyoto-prefecture, Japan
[32] Priority Oct. 10, 1967
[33] Japan
[31] 42/65087

[54] OPERATIONAL AMPLIFIER
1 Claim, 3 Drawing Figs.

[52] U.S. Cl. ........ 330/9, 330/151, 330/75
[51] Int. Cl. ........ H03f 1/02, H03f 1/14
[50] Field of Search ........ 330/9

[56] References Cited
UNITED STATES PATENTS
2,919,409 12/1959 Williams, Jr. ........ 330/9
2,946,009 7/1960 Gelles ........ 330/9X

*Primary Examiner*—Nathan Kaufman
*Attorney*—Wenderoth, Lind and Ponack

ABSTRACT: An operational amplifier for constituting an apparatus such as, for instance, an analog computer. The amplifier has a very high input impedance so that only a very low value of signal current is drawn from the signal source. A stationary component in the signal voltage appearing at the signal input terminal is amplified by a chopper-stabilized direct-current amplifier having a chopper and a synchronous demodulator, and then is applied to a feedback point located at the junction between the two operational impedances, after passing through a direct-coupled amplifier. The voltage at the feedback point is equilibrated to the input signal applied to the input signal terminal by feedback action, and in reaction to this equilibrium value, output voltage is taken out at the output terminal. Since the input signal current is not taken directly into the operational impedance, but is led to an amplifier of high input impedance, the input impedance can be made extremely high, resulting in increasing the precision of mathematical operations.

( PRESENT INVENTION )

Fig. 3. (PRESENT INVENTION)

TOSHIO FUKUDA,
*INVENTOR.*

BY Wenderoth, Lind & Ponack
Attorneys

OPERATIONAL AMPLIFIER

This invention relates to an operational amplifier, and more particularly to an operational amplifier having an extremely high input impedance.

This type of operational amplifier, however, has the shortcoming of being unable to perform the mathematical operation without taking current from the signal source.

The object of the present invention is to provide an improved operational amplifier.

More particularly, an object of the present invention is to provide an improved new operational amplifier capable of performing high precision mathematical operations.

Another object of the present invention is to provide an improved new operational amplifier having high input impedance capable of performing precise mathematical operation on both stationary and transient components without taking out signal current from signal sources.

The operational amplifier according to the present invention comprises a first wide-band alternating-current differential amplifier having a high input impedance and a high common mode rejection ratio, having connected to its one input terminal a signal input terminal, and having its other input terminal connected to a feedback point, i.e., the junction of one end of a first operational impedance, the other end of which is connected to the output terminal, and one end of a second operational impedance the other end of which is grounded. A chopper-stabilized direct-current amplifier, having a high input impedance and a high common mode rejection ratio, has connected to its one input terminal said signal input terminal, and has its other terminal connected to said feedback point. A direct-coupled amplifier amplifies the signal generated by summing the output signal of said first wide-band alternating-current differential amplifier and the output signal of said chopper-stabilized direct-current amplifier, and feeds its output signal to said output terminals.

Said first wide-band alternating-current differential amplifier functions to amplify the high frequency component, i.e. the transient component of the input signal, while said chopper-stabilized direct-current amplifier functions to amplify the low frequency component, i.e., the stationary component.

Said direct-coupled amplifier functions to amplify the summed output signal made up of the output signal of said wide-band alternating current differential amplifier and the output signal of said chopper-stabilized direct-current amplifier, and to supply the output to said output terminal and said operational impedances connected to the output terminal.

Said chopper-stabilized direct-current amplifier is composed of a chopper device which has its one input terminal connected to said feedback point; a second alternating-current differential amplifier having a high input impedance and a high common mode rejection ratio has its one input terminal connected to said signal input terminal and its other input terminal connected to the output terminal of said chopper device; and a synchronous demodulator synchronously demodulating the output of said second alternating-current differential amplifier.

Said chopper device can be either an electronic chopper composed of electronic switching elements, or a mechanical chopper driven by an electromagnetic mechanism. This chopper device functions to supply alternatively the voltages from said input terminal and from said feedback point to one of the input terminals of said second alternating-current differential amplifier.

Said second alternating-current differential amplifier functions to amplify the alternating-current signal obtained from said chopper when there is a voltage difference between voltages of said signal input terminal and said feedback point.

Said synchronous demodulator can be either an electronic demodulator composed of electronic switching elements or a mechanical demodulator driven by an electromagnetic mechanism. This demodulator functions to demodulate the alternating current signal output from said second alternating current differential amplifier for producing direct current output.

Said first and second alternating current differential amplifiers are constructed to have a high input impedance so as not to take the signal current into their input terminals. Therefore, it is desirable that the first stages of these alternating current differential amplifiers have MOS-type field-effect transistors. It is also desired that they amplify exactly said stationary and transient components, respectively, reacting only to the voltage differences between the two input terminals, even when the voltages of the respective terminals changes in the same way. Therefore, it is desirable that the first stage amplifiers of these alternating-current differential amplifiers have a high common mode rejection ratio.

The details of this invention can best be understood from the following description, taken together with the accompanying drawings in which:

FIG. 3 is a schematic circuit diagram of an operational amplifier embodying the present invention.

A chopper-stabilized amplifier has been described, for example, by E. A. Goldbert in an article: Stabilization of Wide-Band Direct-Current Amplifiers for Zero and Gain (R.C.A. Review, June 1950, p 296).

Figure 1:
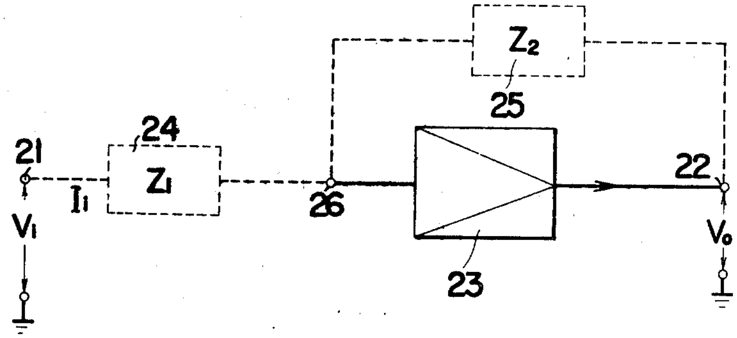
Fig. 1. (PRIOR ART)
FIG. 1 is a schematic circuit diagram of a known chopper-stabilized operational amplifier.
Figure 1:
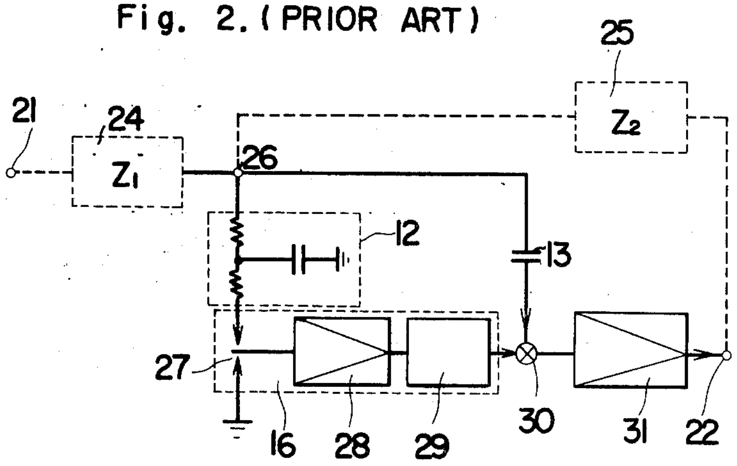
Fig. 1. (PRIOR ART)

A brief description of this known operational amplifier is as follows:

FIG. 1 shows the circuit diagram of the known chopper-stabilized type of operational amplifier. The amplifier has an input terminal 21, an output terminal 22, amplifier 23, and operational impedance elements 24 and 25 having impedances $Z_1$ and $Z_2$, respectively. A feedback point 26 is provided between impedance 24 and amplifier 23 to feed from the output back to the input of amplifier 23. Assuming the input voltage to this operation device to be $Vi$ and the output voltage $Vo$, and if the gain of amplifier 23 is sufficiently high, the following relations will be established:

$$Vo=\frac{Z_2}{Z_1}\cdot Vi$$

On the other hand, signal current $Ii$ supplied from the signal source to this operational amplifier is expressed as follows:

$Ii=Vi/Z_1$

Generally speaking, it is desired that the value of this current $Ii$ be low. One of the reasons is the desire for low power consumption when the operational amplifier is part of an analog computer, etc., but the main reason is that if $Ii$ can be kept sufficiently low, the effect of the output impedance of the signal source on the operational precision can be disregarded. In order to make $Ii$ low, it is necessary to select impedances $Z_1$ and $Z_2$ which are sufficiently high. Because these operational impedances $Z_1$ and $Z_2$ must vary in accordance with the kinds of mathematical operation to be performed, it is not always possible to select absolute values which are high enough.

Figure 2:
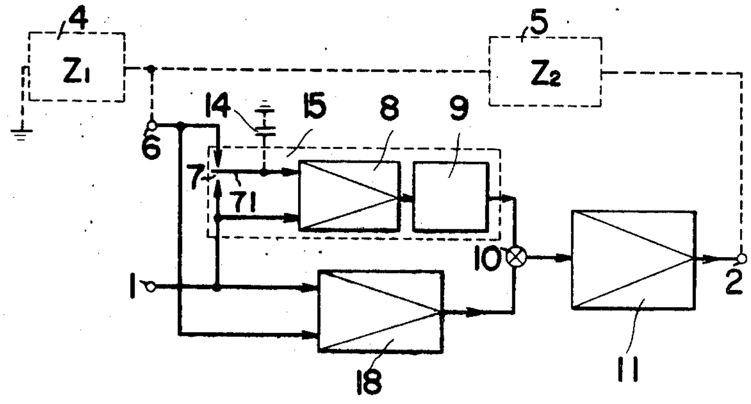
Fig. 2. (PRIOR ART)
FIG. 2 is a detailed schematic circuit diagram of a part of the amplifier of FIG. 1.

FIG. 2 illustrates details of the device shown in FIG. 1, especially details of amplifier 23. The amplifier includes a chopper-stabilized direct current amplifier 16 having a chopper 27, an alternating-current amplifier 28, and a synchronous rectifier 29 acting synchronously with chopper 27. A summing junction 30 is provided at which is produced the sum of the stationary component, i.e., the output signal from chopper-stabilized direct-current amplifier 16 and the high frequency transient component of the input signal taken from feedback point 26 through capacitor 13. This sum is supplied to the input terminal of a succeeding direct-coupled amplifier 31. A low-pass filter 12 is situated between feedback point 26 and chopper 27. It passes only the low frequency stationary component to be amplified by the chopper-stabilized direct-current amplifier.

The operation of this prior art amplifier is as follows. When a signal voltage is applied to input terminal 21 of the operational amplifier, this voltage is divided in a ratio of $Z_1$: $Z_2$ by impedances $Z_1$ and $Z_2$ of impedance elements 24 and 25, and this divided voltage is imparted to feedback point 26. A low frequency component, i.e., the stationary component of this signal is transformed by chopper 27 into alternating current and amplified, and then synchronously rectified by synchronous rectifier 29. On the other hand, the high frequency component is directly added to the output signal of the above-mentioned synchronous rectifier through capacitor 13. The compound signal thus developed is amplified by direct-coupled amplifier 31 and supplied to output terminal 22 as an output. This voltage is divided by operational impedance elements 25 and 24 and negatively fed back to feedback point 26.

Since this kind of operational amplifier can cover a sufficiently broad band width by handling the low frequency component and the high frequency component through the respective channels, it can adequately follow rapid signal changes with no drift for the stationary component, and can consequently perform precise mathematical operations on input signals applied to terminal 21. If the amplification factor of the chopper-stabilized direct-current amplifier 16 preceding the direct-coupled amplifier 31 is sufficiently high, a drift occurring in the direct-coupled amplifier 31 does not affect the output. This type of operational amplifier, however, has the shortcoming of being unable to perform the mathematical operation without taking current from the signal source.

In FIG. 3, showing the operational amplifier of the present invention, the signal input terminal of the operational amplifier is shown at 1 and the output terminal of the operational amplifier is shown at 2. The operational impedance elements are shown at 4 and 5, the impedance 5 having one end connected to output terminal 2. A chopper-stabilized direct-current amplifier 15 is provided comprising a chopper 7 connected to input terminal 1, an alternating-current differential amplifier 8 having a pair of input terminals, one connected to the chopper and the other to the input terminal 1, and a synchronous demodulator 9 connected to the differential amplifier 8 and operating synchronously with said chopper 7. Said chopper is a BBM-type (break-before-make-type) chopper in which moving contact 71 touches one fixed contact after completely being separated from the other fixed contact. The amplifier 8 comprises in its first stage a pair of field-effect long-tailed high common-source resistances, employing, for instance, a pair of MOS-type field-effect transistors, in order to have a high common mode rejection ratio.

A wide-band alternating-current differential amplifier 18 is provided having a pair of high input-impedance terminals, one of which is connected to the input terminal, and having a high common mode rejection ratio. The outputs of the chopper-stabilized direct current amplifier 15 and the differential amplifier 18 are connected at a summing junction 10 for summing outputs of the alternating-current differential amplifier 18 and chopper-stabilized direct-current amplifier 15. A feedback terminal 6 is provided at the junction of the one end of operational impedances 4 and 5. It is connected to the other terminal of the chopper 7 and the other terminal of differential amplifier 18. A direct-coupled amplifier 11 has an input connected to the summing junction 10 and the output connected to output terminal 2. The stray capacity existing between the moving contact 71 of the chopper 7 and ground is represented at 14. In this construction, the polarity of input signals to the input terminal 1 and that of the signal at the feedback point 6 is the same.

In operation, the input signal is separated into a transient component and a stationary component. Said transient component, i.e., the higher frequency component in the input signal applied to the signal input terminal 1 is amplified by the wide-band alternating-current differential amplifier 18, and is led to the direct-coupled amplifier 11 through the summing junction 10, and then applied to the operational impedances 5 and 4 from the output terminal 2, and further fed back negatively to the feedback point 6.

On the other hand, the stationary component, i.e., the lower frequency component in the input signal applied to the signal input terminal 1, is amplified by the chopper-stabilized direct-current amplifier 15.

When there is a voltage difference between the input signal at the input terminal 1 and the signal at the feedback point 6, alternating-current voltage is developed between the pair of input terminals of the alternating-current differential amplifier 8, because moving contact 71 of the chopper 7 alternately connects respectively to the signal input terminal 1 and the feedback terminal 6. The alternating-current voltage thus developed is amplified by the amplifier 8, and then demodulated by synchronous demodulator 9 into a direct-current output, and further is applied to the input terminal of the direct-coupled amplifier 11 through summing junction 10. If the signal appearing at the signal input terminal 1 and the signal appearing at the feedback point 6 are of the same voltage and the same phase, the chopper-stabilized direct-current amplifier 15 produces virtually no output signal, even when the respective input signals change greatly in the same voltage and phase, owing to the fact that the alternating current differential amplifier 8 has said first stage with a high common mode rejection ratio. By means of the stray capacity 14 of moving contact 71 in chopper 7 with respect to ground, despite the fact that it is a BBM-type, no voltage spike is developed between the pair of input terminals of the alternating-current differential amplifier 8, even when the signal voltages are not zero, if the voltages at the signal input terminal 1 and the feedback point 6 are equal. The reason is that, on account of the very high input impedance of the alternating-current differential amplifier 8, the voltage of the moving contact 71 of the chopper 7, during its neutral position, is held by the stray capacity 14 at the voltage of the contact which this moving contact 71 has contacted immediately before.

In this operational amplifier, the signal input terminal 1 and the feedback point 6 are sufficiently insulated from each other electrically for practical purposes, owing to the employment of the BBM-type chopper. Strictly speaking, however, it is impossible to achieve absolute separation because of the leakage of the current from the input terminal 1 through the moving contact 71 to the stray capacitor 14, and then from the capacitor 14 through the moving contact 71 to the feedback point 6. However, this phenomenon diminishes to a negligible amount after the voltages between the terminal 1 and the point 6 are equilibrated after a short period. To sum up the above, the stationary component of the input signal amplified by the chopper-stabilized direct-current amplifier 15 having the above described features is led to the output terminal 2 through the direct-coupled amplifier 11, and this stationary component is led to the feedback point 6 being divided by the operational impedances $Z_1$ and $Z_2$, and then the voltage at the point 6 is equilibrated with that of the signal at the input terminal 1.

As explained above, in the operational amplifier of the present invention, negative feedback action is exactly performed for the transient component and the stationary component. Accordingly, by the principle set forth regarding the known art in FIG. 2, the operational amplifier of this invention is able to perform precise mathematical operations on signals of wide frequency ranges. Moreover, as already explained, the input impedance at the input terminal 1 of the operational amplifier of this invention is very high, owing to the very high input impedances of the chopper-stabilized direct-current amplifier 15 and the wide-band alternating-current differential amplifier 18, and also owing to the fact that the separation between the signal input terminal 1 and the feedback point 6 is sufficient for practical purposes, so that it is practicable to construct an operational amplifier of high precision according to FIG. 3 which has very desirable high input impedance characteristics.

I claim:

1. An operational amplifier comprising:

a first signal input terminal;

a second signal input terminal constituting a feedback point to which one end of both a first operational impedance and a grounded second operational impedance are adapted to be connected;

a first wide-band alternating-current differential amplifier having a high input impedance and a high common mode rejection ratio and having two amplifier input terminals, one of which is connected to said first signal input terminal and the other of which is connected to said second signal input terminal, and further having an output terminal;

a signal output terminal to which the other end of the first operational impedance is adapted to be connected;

a chopper-stabilized direct-current amplifier having a high input impedance and a high common mode rejection ratio; and comprising a chopper having a first chopper input terminal connected to said first signal input terminal and a second chopper input terminal connected to said second signal input terminal, and a chopper output terminal, a second alternating-current differential amplifier having a high impedance and a high common mode rejection ratio and having a first input terminal connected to said first signal input terminal and a second input terminal connected to the chopper output terminal, and an output terminal, and a synchronous demodulator coupled to said output terminal of said second alternating-current differential amplifier for synchronously demodulating the output of said second alternating-current differential amplifier and having an output terminal; and a direct-coupled amplifier having an input terminal connected to said output terminal of said synchronous demodulator and to the output terminal of said first alternating-current differential amplifier and having an output terminal connected to said signal output terminal, so as to amplify the signal generated by summing the output signals of said first alternating-current differential amplifier and said synchronous demodulator.